United States Patent
Nagahashi

(10) Patent No.: US 6,753,942 B2
(45) Date of Patent: Jun. 22, 2004

(54) ENVIRONMENTAL CONTROL CHAMBER

(75) Inventor: Yoshitomo Nagahashi, Gunma-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/289,296

(22) Filed: Nov. 7, 2002

(65) Prior Publication Data

US 2003/0058417 A1 Mar. 27, 2003

Related U.S. Application Data

(63) Continuation of application No. 09/905,079, filed on Jul. 16, 2001, now abandoned, which is a continuation of application No. 08/824,295, filed on Mar. 26, 1997, now abandoned.

(30) Foreign Application Priority Data

Mar. 28, 1996 (JP) ................................................ 8-99320

(51) Int. Cl.[7] .......................... G03B 27/52; G03B 27/42
(52) U.S. Cl. ........................................ 355/30; 355/53
(58) Field of Search ............................. 355/30, 53, 55, 355/67

(56) References Cited

U.S. PATENT DOCUMENTS

| | | | |
|---|---|---|---|
| 4,690,528 A | 9/1987 | Tanimoto et al. ............ 353/101 |
| 4,786,947 A | 11/1988 | Kosugi et al. ................. 355/30 |
| 4,875,076 A | 10/1989 | Torigoe ......................... 355/53 |
| 4,989,031 A | 1/1991 | Kamiya ......................... 355/30 |
| 5,326,316 A | 7/1994 | Hashimoto et al. .......... 454/187 |
| 6,002,987 A | * 12/1999 | Kamiya et al. ................ 702/56 |

* cited by examiner

Primary Examiner—Henry Hung Nguyen
(74) Attorney, Agent, or Firm—Westerman, Hattori, Daniels & Adrian, LLP

(57) ABSTRACT

This invention is an exposure apparatus with an environmental control chamber for forming a closed space. An air conditioning device for circulating air in the closed space along a predetermined course of flow path. A main body of an exposure device which is disposed in a closed space formed by the environmental control chamber at a predetermined position along the predetermined course of flow path from the air conditioning device and exposes a substrate with a predetermined pattern. A heat-discharging box disposed in the environmental control chamber at least on the downstream side of the flow path from the main body of the exposure device and accommodating a first heat source which is detachable from the main body of the device.

11 Claims, 4 Drawing Sheets

ENVIRONMENTAL CONTROL CHAMBER

This application is a Continuation Ser. No. 09/905,079, filed Jul. 16, 2001 now abandoned, which is a Continuation of application Ser. No. 08/824,295, filed Mar. 26, 1997, abandoned.

BACKGROUND OF THE INVENTION

The present invention relates to an environmental control chamber and, more particularly, to an environmental control chamber with, for example, a semiconductor exposure device or a coordinates measuring machine by an optical interferometer mounted in its inner space, the environmental control chamber being connected to an air conditioning apparatus.

A conventional environmental control chambers of this type comprises a closed space that is connected to an air conditioning apparatus having an air blower, a cooler, a heater and a temperature controller and controlled so as to maintain temperature, humidity and a degree of air cleanliness (hereinafter referred to as an "air cleanliness degree") within the chamber at their constant values. In the environmental control chamber may be disposed, for example, a semiconductor exposure device (hereinafter referred to as a "stepper").

As shown in FIG. 4, reference numeral 1 denotes an environmental control chamber as a whole with a stepper 2 disposed therein. The stepper 2 is structured in such a way that rays of illuminating light are irradiated from an illumination optical system 3 onto a reticle 4 and that a desired pattern formed on the reticle 4 is illuminated as an image through a projecting lens 5. In a member 6 disposed immediately under the projecting lens 5 are located a wafer 7 and a wafer stage 8 and the wafer 7 with a photoresist layer coated thereon is exposed to rays of projecting light emitted from the projecting lens 5, thereby transcribing the image constituted by the desired pattern formed on the reticle 4.

In the stepper 2, it is required to align the rays of projecting light projected from the projecting lens 5 with the wafer 7 at a high degree of precision in order to allow an accurate exposure of the rays of projecting light to the wafer. At this end, the coordinates of the wafer stage 8 for an alignment of the wafer 7 disposed thereon are measured by means of a end measuring machine 9 by a laser interferometer. The end measuring machine 9 by the laser interferometer is designed to allow a laser head 10 to send laser light out to reflecting mirrors 11, respectively, disposed at a peripheral side portion of an outlet through which the rays of light projected for exposure of the wafer 7 and on the wafer stage 8. The laser light emitted is reflected by the reflecting mirrors 11 and returns to and detected by the end measuring machine 9 by the laser interferometer. The end measuring machine 9 by the laser interferometer then can measure the distance between the reflecting mirrors 11 by detecting the laser light returned thereto by reflection. The alignment of the wafer 7 is then carried out on the basis of this result.

As turnovers of semiconductor elements prepared by transcribing the pattern of the reticle 3 onto the wafer 7 are affected to a great extent with an amount of dust in the air, a high air cleanliness degree is required in the environmental control chamber 1. The stepper 2 is provided with a relay board 12 for controlling an electrical instrument system of each device that acts as a source of heat. Further, the laser head 10 emits heat and also acts as another source of heat. In the chamber 1, it is also required to control the temperature at a predetermined level by controlling a rise in the temperature as well as the cleanliness of air so that the chamber 1 is connected to an air conditioning device 13.

The air conditioning device 13 comprises an air blower 14, a heater 15 and a cooler 16. The air conditioning device 13 is arranged in such a manner that air is discharged from the chamber 1 and air is introduced from the outside into the chamber 1 through an intake opening 17 and an intake duct 18. The air introduced into the air conditioning device 13 is then subjected to adjustment of temperature with the heater 15 or the cooler 16 and sent to the chamber 1 with the air blower 14 through an air outlet 19. The air outlet 19 is provided with a filter (not shown) that can remove dust from the air to be introduced into the chamber 1.

The air conditioning device 13 is arranged in the manner as described hereinabove so as to sustain the temperature within the chamber 1 by controlling the temperature of the air while circulating the air within the chamber 1 in a given course of a path. Further, the air conditioning device 13 can remove dust from the air by means of the filter mounted in the course of the path through which to circulate the air, thereby controlling the air so as to sustain the air cleanliness degree within the chamber 1.

With the arrangement of the environmental control chamber 1, it is further required to not only control its temperature, humidity and air cleanliness degree, but also sustain the air therein in a stable fashion by controlling fluctuations of air without being affected by the outside environment, because the air fluctuations may adversely affect precision of the end measuring machine 9 by the laser interferometer and other optical sensors. More specifically, for the end measuring machine 9 by the laser interferometer, the air fluctuations in the course of the path of the laser light emitted for measurement may cause a variation of a reflective index and such a variation may cause an error of measurement, thereby resulting in a decrease in the precision of alignment of the wafer 7.

In order to avoid this, hitherto, attempts have been made to decrease a variation of temperature and unevenness of temperature by improvements in performance for controlling the temperature of the air conditioning device 13.

However, the stepper 2 to be disposed in the chamber 1 is provided with a variety of heat sources, e.g. different kinds of light sources, actuators, the relay board 12 and other devices and those devices are mounted directly on the main body of the stepper 2. Hence, a space is located around those heat sources therein, where the temperature differs locally. Such a difference of the temperatures cannot completely be removed simply by controlling the temperature of the air circulating within the chamber 1 by the air conditioning device 13.

Therefore, the conventional environmental control chambers suffer from the disadvantages that the fluctuations of air caused to occur in such an space where the temperature varies irregularly are transferred to the path of laser light of the end measuring machine 9 by the laser interferometer or to the wafer stage 8 by circulating the air and that the temperature is transmitted to other places within the chamber 1.

SUMMARY OF THE INVENTION

The present invention has been completed with the above matter taken into account and it has the object to provide an environmental control chamber so adapted as to avoid fluctuations of air to be caused to occur on account of a difference of temperatures due to the provision of heat sources in the chamber.

In order to achieve the object as described hereinabove, the environmental control chamber according to the present invention is so adapted as to maintain a space with a main body of a device located therein and with a given kind of fluid filled therein in an optimized environment for operating the main body of the device by circulating the fluid in a predetermined course of a path by an air conditioning device and controlling the temperature and/or humidity and/or air cleanliness degree of the fluid; the chamber being provided with a heat-discharging space disposed on the downstream side of the path from a heat source located in the main body of the device so as to be adiabatic from the space where the main body of the device is disposed; in which the heat-discharging space is constructed so as to gather heat generated from the main body of the device and the heat gathered is discharged to the air conditioning device by the aid of a flow of the fluid circulating through the path.

The environmental control chamber according to the present invention may be constructed in such a manner that an element structuring the heat source of the main body of the device is disposed in the heat-discharging space or that the element structuring the heat source thereof is connected to the heat-discharging space via a heat exchange device.

In the environmental control chamber according to the present invention, there may be employed, as the fluid, air or an inert gas such as nitrogen, neon, argon, krypton, xenon or radon.

Further, for the environmental control chamber according to the present invention, the heat source is a relay board of the semiconductor exposure apparatus and/or a laser head of an end measuring machine by a laser interferometer, when the main body of the device is a semiconductor exposure apparatus.

Furthermore, the environmental control chamber according to the present invention is so adapted as to maintain a space with a main body of a device located therein in an optimized environment for operating the main body of the device, the chamber being provided with a heat-discharging space delimited from the space for locating the main body of the device and structured so as to be heat insulating from the space; and with a cooling device for cooling the heat-discharging space. For the environmental control chamber according to the present invention, the heat-discharging space may be closed from the space with the main body of the device located therein.

In addition, the environmental control chamber according to the present invention may be provided with the heat-discharging space which may be in a shape of a box and which may be made of a heat insulating material.

Other objects, features and advantages of the present invention will become apparent in the course of the following description with reference to the accompanying drawings.

DESCRIPTION OF THE PREFERRED EMBODIMENTS

The present invention will be described in more detail with reference to the accompanying drawings.

Figure 1:
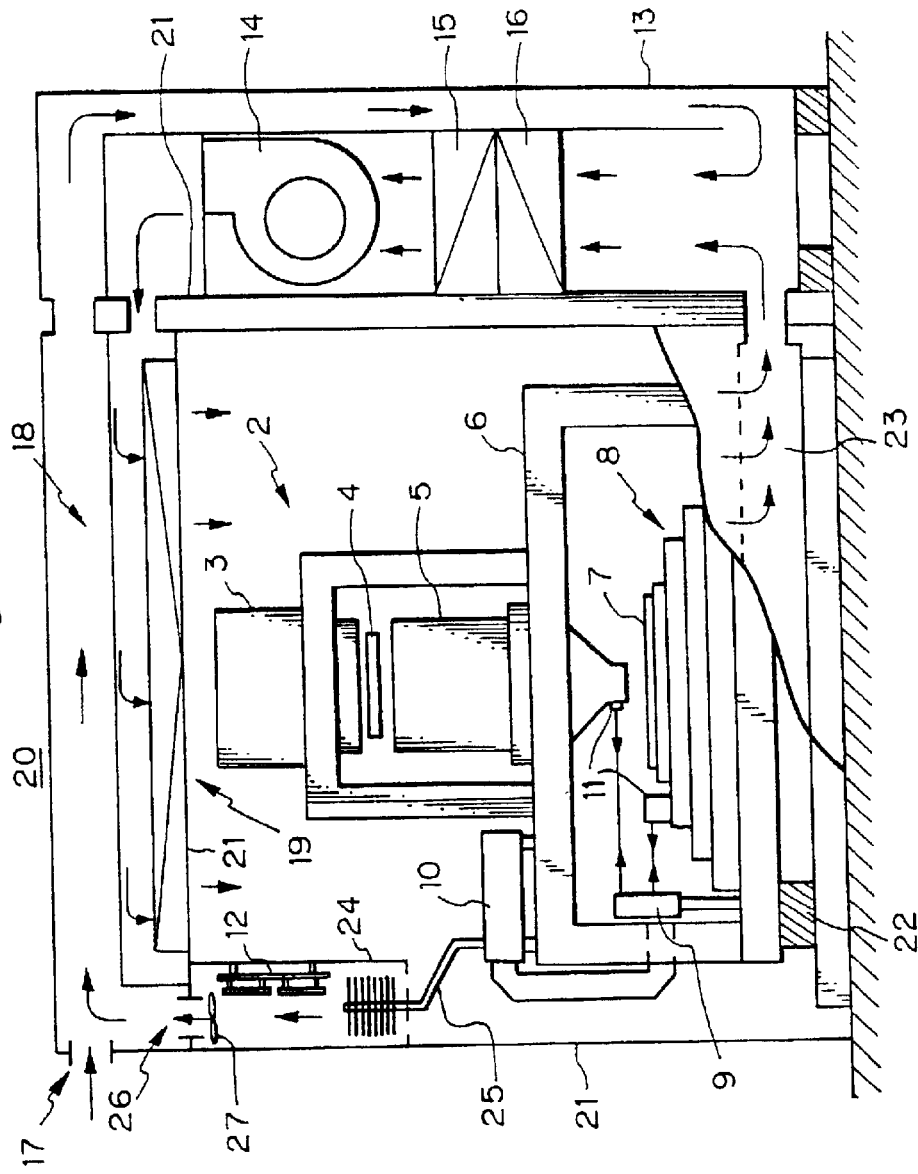
FIG. 1 is a partially exploded schematic side view showing the structure of an environmental control chamber according to an embodiment of the present invention.
Figure 4:
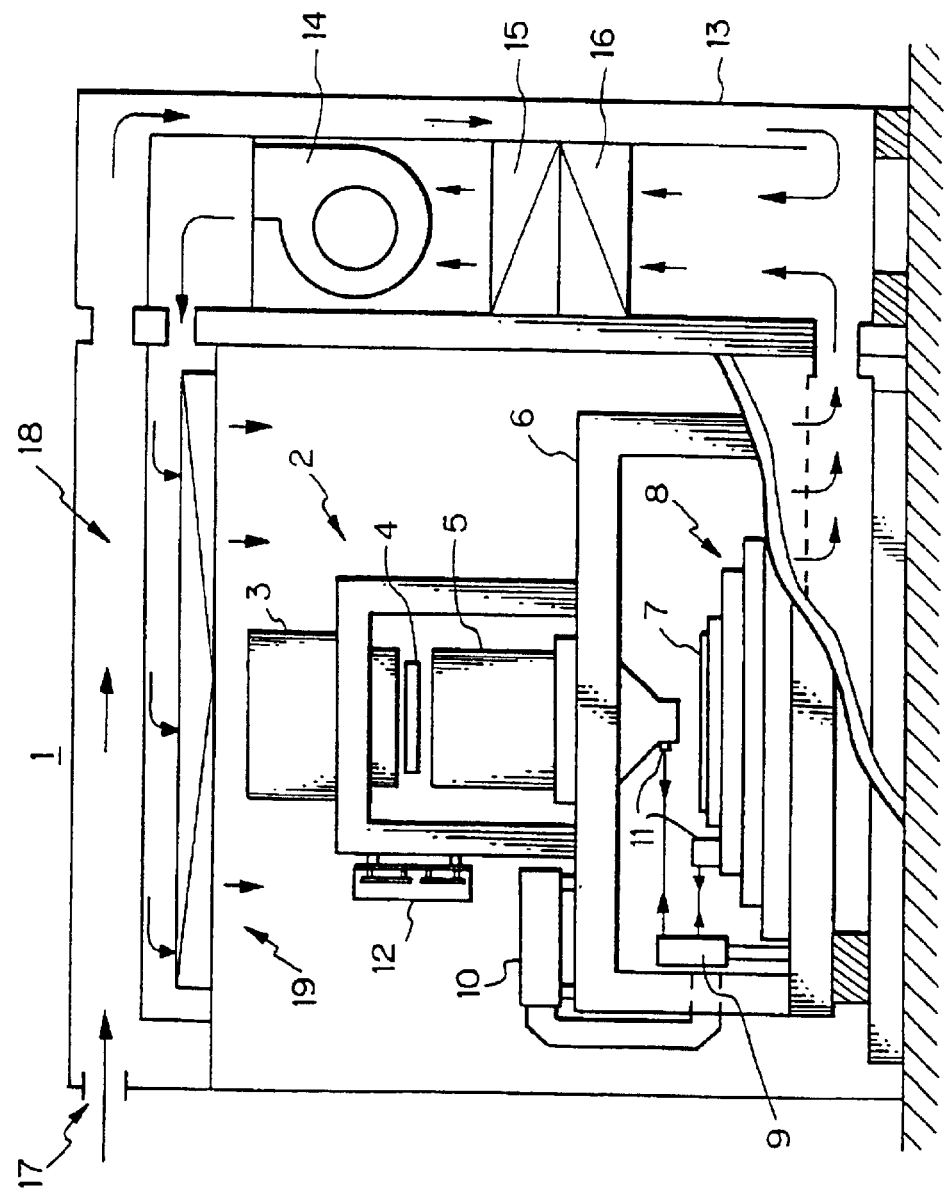
FIG. 4 is a schematic view showing the structure of a conventional environmental control chamber.

FIG. 1 shows the structure of an environmental control chamber according to an embodiment of the present invention, in which the identical elements are provided with the same reference numerals as those provided in FIG. 1. In FIG. 4, reference numeral 20 denotes an environmental control chamber as a whole so arranged as to gather heat in a predetermined space thermally separated from a space with a stepper 2 located therein by accommodating a heat source in the predetermined space or by transferring the heat itself thereinto.

In the stepper 2 disposed in a space enclosed and defined by a partition wall 21 of the environmental control chamber 20, a reticle 4 is irradiated with rays of illuminating light emitted from an illumination optical system 3 to form a pattern on the reticle 4 and the pattern formed thereon is then projected through a projecting lens 5 onto a member 6 located immediately under the projecting lens 5. In the member 6 is disposed a wafer stage 8, and a wafer 7 is located in an light-exposing region on the wafer stage 8. Rays of projecting light from the projecting lens 5 are projected onto a light-exposing region of the wafer 7, thereby transcribing the pattern formed on the reticle 4 on the wafer 7. The member 6 is mounted on a vibration isolation table 22 that can absorb vibration. The heat source (not shown) for emitting rays of illuminating light to the illumination optical system 3 is disposed on the outside of the partition wall 21.

The wafer 7 is disposed so as to become transferable in X- and Y-axial directions by the action of the wafer stage 8 and aligned in a predetermined position by monitoring the location of the wafer by a end measuring machine 9 by the laser interferometer.

The end measuring machine 9 by the laser interferometer is connected to the laser head 10 that emits laser beams for measurement. The laser beams emitted from the laser head 10 are reflected on the reflecting mirrors 11 and disposed over the wafer stage 8 and received by the end measuring machine 9 by the laser interferometer. The reflecting mirrors 11 are mounted on the wafer stage 8 and on a peripheral side portion of a projecting opening through which the rays of projecting light are emitted onto the wafer 7. The end measuring machine 9 by the laser interferometer is arranged to measure a distance between the projecting opening and the wafer stage 8 upon receiving the laser beams reflected from the reflecting mirrors.

The wafer stage 8 can align the wafer 7 on the basis of information on the location obtained by such measurement.

The environmental control chamber 20 is connected to an air conditioning device 13 that is arranged to circulate the air within a space defined and delimited by the partition wall 21 to control the temperature, humidity and degree of air cleanliness within the space defined and delimited by the partition wall 21 defining the space for accommodating the stepper 2.

The air conditioning device 13 circulates the air within the space defined and delimited by the partition wall 21 by an air blower 14 and adjusts the circulating air to a predetermined temperature degree by means of a heater 15 or a cooler 16. The air is then blown into the space defined and delimited by the partition wall 21 through a air blow-off opening 19 after it has been adjusted to the predetermined temperature degree and dust in the air has been removed by a filter, for example, a ULPA filter or the like, mounted on the air blow-off opening. The air blown is allowed to circulate in an air path extending from the periphery of the reticle 2 through the periphery of the projecting lens 5 and the periphery of the wafer stage 8 to the periphery of the end measuring machine 9 by the laser interferometer and then returned to the air conditioning device 13 through a lower return duct 23. The circulating air is caused to be warmed up in the air path during circulation and taken into the air conditioning device 13 again through an air intake duct 18, together with air taken from the outside through the intake opening 17. The combined air is then adjusted to the predetermined degree of temperature and blown again through the air blow-off opening 19 into the space delimited by the partition wall 21. The ULPA filter referred to hereinabove is an air filter capable of collecting particles having a particle size of as small as 0.1 micron.

The environmental control chamber 20 is provided with a heat discharging box 24 in a space in which the stepper 2 is disposed. The heat-discharging box 24 is arranged so as to accommodate a source of heat mounted on the stepper 2 or to gather heat by transferring thereto the heat through a heat pipe 25.

The heat-discharging box 24 is a box-shaped body mounted on an inner wall surface on the upper side of the environmental control chamber 20 and has an opening (not shown) through which air is allowed to pass upwards and downwards. The heat-discharging box 24 is made of a heat insulating material in order to fail to transmit the heat collected therein to the space in which the stepper 2 is disposed. In order to collect the heat, the heat-discharging box 24 is arranged so as to accommodate the heat source therein, one the one hand, in the case where the heat source, such as a relay board 12, can be detached from the stepper 2 and so as to gather the heat therein by transferring the heat from the heat source to the box by means of the heat pipe 25, on the other, in the case where the heat source cannot be detached from the stepper 2. The heat transferred can be gathered in the heat-discharging box 24 by radiating the heat from a heat radiating plate mounted in the box at an edge portion of the heat pipe 25.

The heat-discharging box 24 is further disposed in the air path through which the air circulates in the environmental control chamber 20, thereby discharging the heat collected therein to the air conditioning device 13 through the medium of the air circulating therethrough.

The heat-discharging box 24 is provided at its lower portion with an opening acting as an air inlet opening and at its upper portion with an upper return duct 26 communicating with the air conditioning device 13 and with a fan 27. The heat warmed up in the box is allowed to be forcibly discharged by the fan 27 through the upper return duct 26 to the air conditioning device 13. This enables the heat collected in the box to discharge into the air conditioning device.

With the arrangement as described hereinabove, the heat source disposed in the environmental control chamber 20 generates heat on operating the stepper 20. The relay board 12 acting as one of the sources of heat is operated by the electric power supplied from a control rack (not shown) disposed in the vicinity of the stepper 2. Upon operation, the relay board 12 generates Joule heat in accordance with the consumption of the electric power and warms up the air in its vicinity causing the air to fluctuate. The fluctuations of the air remain within the heat-discharging box 24 in the environmental control chamber 20 because the relay board 12 is disposed in the heat-discharging box 24. However, as the heat-discharging box 24 is made of heat insulating material, the heat existing therein can be prevented from transmitting to the space with the chamber 20 disposed therein. Further, the heat-discharging box 24 can prevent an occurrence of the air fluctuations in the space with the stepper 20 disposed therein.

The laser head 10 acts as another source of heat. The laser head 10 generates heat upon generating laser beams to be supplied to the end measuring machine 9 by the laser interferometer. To the laser head 10 is connected the heat pipe 25 that can transfer the heat generated by the laser head 10 to the heat-discharging box 24 from its higher temperature portion to its lower temperature portion in accordance with a heat ingredient. The heat transferred is then discharged into the air from the heat radiating plate mounted at the edge portion of the heat pipe 25. By discharging the heat generated by the laser head 10 into the heat-discharging box 24. the transmission of the heat to the periphery of the laser head 10 and the main body of the stepper 2 can be avoided preventing an occurrence of the air fluctuations.

The heat-discharging box 24 is also arranged so as to discharge the air taken thereinto from a lower opening through the upper return duct 26 by the aid of the fan 27. As the heat-discharging box 24 is disposed on the downstream side of the air path through which the air allows to pass upwards upon being warmed up, a flow of the air to be blown from the air blow-up opening 19 can be blown readily into the box.

With the arrangement as described hereinabove, the environmental control chamber 20 is so disposed as to allow the heat generated in the space with the stepper 2 disposed therein to be collectively gathered in the heat-discharging box 24 by accommodating the heat source detachable from the stepper 2, such as the relay board 12, in the box and by transferring the heat through the heat pipe 25 to the box in the case where the heat source cannot be detached from the stepper 2, such as the laser head 10. The heat gathered in the heat discharging box 24 is then transmitted to the air conditioning device 13 by forcibly discharging the air in the box by the aid of the fan 27.

Therefore, the environmental control chamber 20 can prevent the air from fluctuating due to the heat generated by the stepper 2 in the space where the stepper is disposed.

With the arrangement as described hereinabove, the environmental control chamber 20 has the heat-discharging box 24 located thermally separate from the space in which to locate the stepper 2 and constructed so as to collectively gather heat generated by the stepper 2. Therefore, the environmental control chamber 20 can avoid a local rise in temperature and reduce irregularities of temperature in the space where the stepper 2 is located, on the one hand, by locating in the heat-discharging box 24 the relay board 12 that can be detached from the stepper 2 and, on the other, by transferring the heat generated from the laser head 10 through the heat pipe 25 connected thereto in the case where the laser head 10 cannot be detached from the stepper 2. Therefore, the arrangement as described hereinabove can realize the environmental control chamber 20 that can avoid an occurrence of the fluctuations of air therein due to the heat generated by the laser head 10 and the relay board 12.

In the embodiment as described hereinabove, a description was made of the case where the stepper 2 that is a semiconductor exposure apparatus is disposed in the environmental control chamber 20. It is to be understood, however, that the present invention is not limited to the embodiment as described hereinabove and the present invention can be construed as encompassing the case where any device having an optical sensor can be applied to the environmental control chamber with other devices disposed therein.

Further, in the embodiment as described hereinabove, a description was made of the case where the heat-discharging box 24 is located which constitutes the space thermally separate from the space in which to locate the stepper 2 and which can gather the heat generated from the stepper 2 and where the heat is discharged to the air conditioning device 13 by means of the circulation of air. It is to be understood, however, that the present invention is not limited to the embodiment as described hereinabove and the present invention can be construed as encompassing the case where the heat-discharging box may be located thermally and spatially separated from the space in which the stepper 2 is located.

Figure 2:
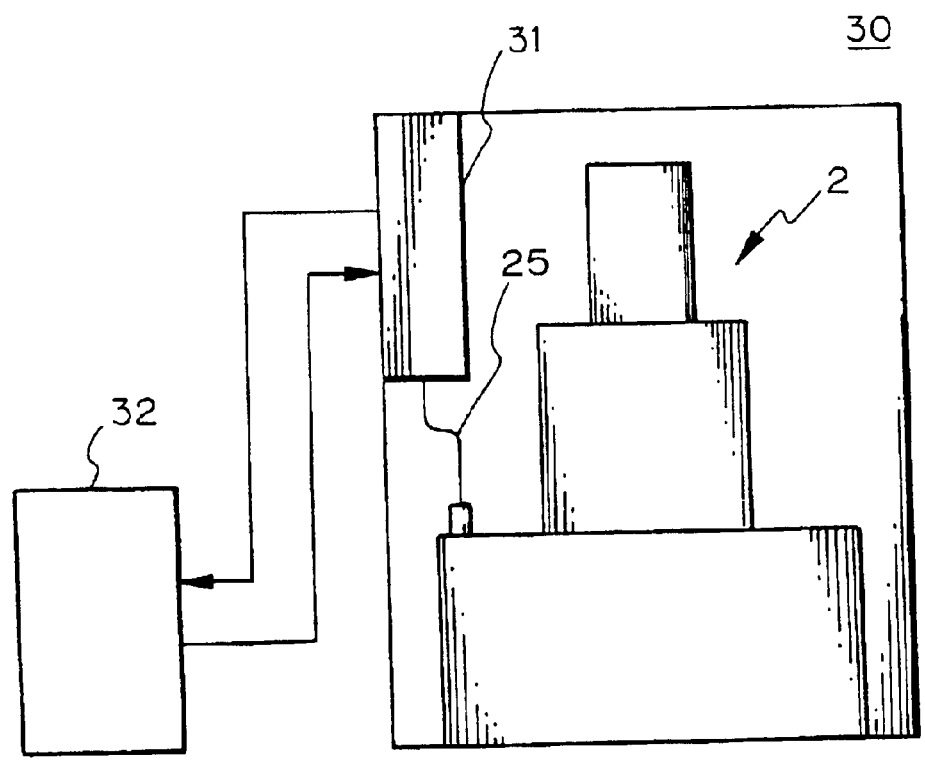
FIG. 2 is a schematic view showing another embodiment of the environmental control chamber according to the present invention.

Turning now to FIG. 2 in which the elements identical to those of FIG. 1 are provided with the same reference numerals, a heat-discharging box 31 in an environmental control chamber 30 is of a closed body thermally and spatially separated from the space where the stepper 2 is located. To the heat-discharging box 31 is connected a cooler 32 that cools the heat gathered in the heat-discharging box 31 through the heat pipe 25.

As the cooler 32 to be located in the heat-discharging box 31, there may be mentioned, for example, an air conditioning device separate from the air conditioning device 13 (FIG. 1), a cooler using a liquid refrigerant or a electronic cooler using Peltier effect. The heat-discharging box 31 may be provided with a fan (not shown) or a heat discharging opening (not shown), thereby discharging the heat gathered in the heat-discharging box 31 toward the outside.

Figure 3:
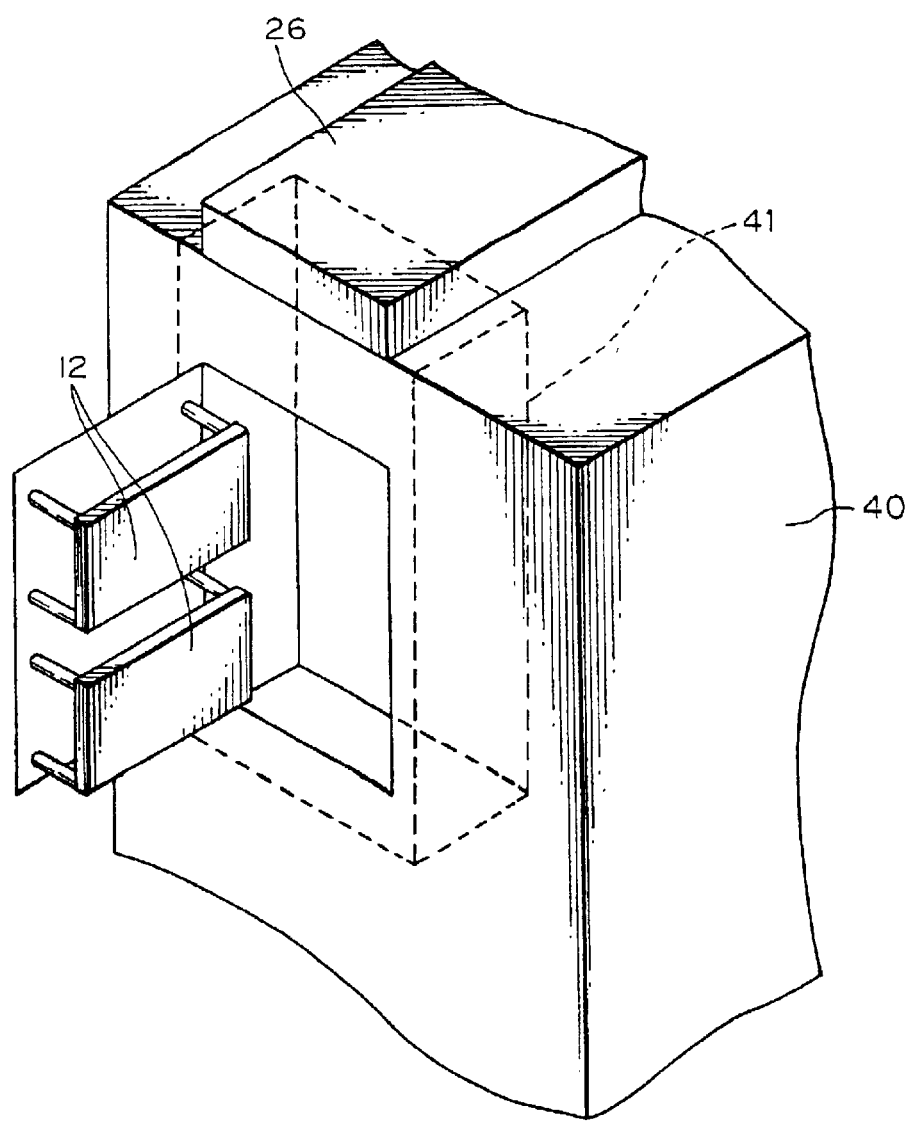
FIG. 3 is a perspective view showing the structure of a heat discharging box of the environmental control chamber according to another embodiment of the present invention.

Furthermore, a description will be made of an environmental control chamber with reference to FIG. 3 wherein the same elements as those of FIG. 1 are provided with the same reference numerals. As shown in FIG. 3, an environmental control chamber 40 is provided with a heat-discharging box 41 that has an openable door 42 at a portion of its side wall surface facing the outside of the chamber. On the door 42 is a relay board 12. With the arrangement of the environmental control chamber 40 in which the heat-discharging box 41 is provided with the door 42 in the above mentioned manner and the relay board 12 is mounted on the door, maintenance work can be conducted readily from the outside by opening the door 42.

It is also possible to make the heat-discharging box 41 itself of a door structure so as to be openable toward the outside. This arrangement enables a ready maintenance work for the inside of the environmental control chamber 40 as well as for the inside of the heat-discharging box 41.

In the embodiments as described hereinabove, a description was made of the case where the heat-discharging box is disposed singly. It is to be understood, however, that the present invention is not limited to the embodiments as described hereinabove and the present invention can be construed as encompassing the cases where the heat discharging box may be divided into plural boxes and the boxes are disposed at plural locations. This arrangement can make heat capacity per box smaller and allows each of the boxes to be located in the vicinity of each heat source even where a plurality of the heat sources that cannot be detached from the stepper 2 are located in the environmental control chamber.

Further, in the embodiments as described hereinabove, a description was made of the case where the heat-discharging box is of a box shape. It is to be understood, however, that the present invention is not limited to the embodiments as described hereinabove and the present invention can be construed as encompassing the cases where the heat-discharging box is of a shape other than the box shape, such as a column shape circular in section or the like.

Furthermore, in the embodiments as described hereinabove, a description was made of the case where the heat-discharging box is of a box shape. It is to be understood, however, that the present invention is not limited to the embodiments as described hereinabove and the present invention can be construed as encompassing the cases where the heat-discharging box may be constructed so as to allow a portion of an outer wall of the heat-discharging box to be opened.

In the embodiments as described hereinabove, a description was made of the case where air is used as a fluid for circulating within the environmental control chamber. It is to be understood, however, that the present invention is not limited to the embodiments as described hereinabove and the present invention can be construed as encompassing the cases where such fluid may be any other inert gas, including nitrogen, helium, neon, argon, krypton, xenon or radon, for example. If the fluid including air would run short in the environmental control chamber due to leakage or for other reasons, it can be supplemented through the intake opening 17.

When a source of light (not shown) is located in the space enclosed by the partition wall 21, in other words, in the environmental control chamber 20, it is also possible to locate a lamp house itself including the light source in the heat-discharging box 24 disposed in the environmental control chamber.

As described hereinabove, the environmental control chamber can avoid a local rise in temperature and reduce irregularities of temperatures in the space in which to locate the main body of the device by locating the space in which to gather heat generated from the main body of the device, the space being thermally separated from the space where the main body thereof is disposed, on the one hand, by locating in the heat discharging space a heat source that can be detached from the main body thereof and, on the other, by transferring the heat generated from the heat source by a heat exchange device thereto in the case where the heat source cannot be detached from the main body thereof. This arrangement of the environmental control chamber can realize an environmental control chamber that can avoid fluctuations of air to be otherwise caused to occur due to a difference of temperatures at locations on account of the disposition of the heat source.

What is claimed is:

1. An exposure apparatus comprising;
    an environmental control chamber for forming a closed space;
    an air conditioning device for circulating air in said closed space along a predetermined course of flow path, said closed space is formed by said environmental control chamber;
    a main body of an exposure device which is disposed in said closed space formed by said environmental control chamber at a predetermined position along said predetermined course of flow path from said air conditioning device and which exposes a substrate with a predetermined pattern;

a heat-discharging box disposed in said environmental control chamber at least on the downstream side of said flow path from said main body of the exposure device and accommodating a first heat source which is detachable from said main body of the device; and a heat pipe which is disposed between a second heat source undetachable from said main body of the device; and said heat-discharging box and which transmits heat from said second heat source to an inside of said heat-discharging box so that heat is not transmitted through air in said environmental control chamber.

2. An exposure apparatus as claimed in claim 1, wherein said main body of the device includes a projection optical system for projecting said predetermined pattern onto said substrate and a stage on which the substrate is disposed and a measuring device for detecting positional information on said substrate;

wherein said heat-discharging box accommodates a first heat source which is detachable from said main body of the device including the projection optical system, said stage and said measuring device; and wherein said heat pipe is disposed between a second heat source which is undetachable from said main body of the device including the projection optical system, said stage and said measuring device, and said heat-discharging box, so that said heat pipe transfers heat from said second heat source to the inside of said heat-discharging box so that heat is not transmitted through air in said environmental control chamber.

3. An exposure apparatus as claimed in claim 2, said air conditioning device including:

a blower for circulating air in said closed space along a predetermined course of flow path, said closed space is formed by said environmental control chamber;

a temperature control device for controlling temperature of air which is circulated along said predetermined course of flow path; and a filter for removing dust within air which flows along said predetermined course of flow path.

4. An exposure apparatus as claimed in claim 3, wherein said exposure apparatus comprises a plurality of said first heat sources or said second heat sources and also comprises a plurality of said heat-discharging boxes corresponding to said plurality of said first heat sources or said second heat sources.

5. An exposure apparatus as claimed in claim 3, wherein said first heat source detachable from said main body of the device is a relay board for controlling an electrical instrument system of said main body of the device.

6. An exposure apparatus as claimed in claim 3, wherein said measuring device is a measuring device for detecting positional information of said substrate and wherein said second heat generating device undetachable from said main body of the device is a laser head for generating laser light used for said measuring device.

7. A method for exposing said substrate by using said exposure apparatus as claimed in claim 3.

8. A method for manufacturing an exposure apparatus, comprising:

providing an environmental control chamber which forms a closed space;

providing an air conditioning device which circulates air in said closed space along a predetermined course of flow path, said closed space being formed by said environmental control chamber;

disposing a main body of an exposure device in said closed space formed by said environmental control chamber and at a predetermined position along said predetermined course of flow path of said air conditioning device, said main body of the device exposing a substrate with a redetermined pattern;

disposing a heat-discharging box in said environmental control chamber at least on the downstream side of said flow path from said main body of the device, said heat-discharging box accommodating a first heat source which is detachable from said main body; and providing a heat pipe between a second heat source undetachable from said main body of the device and said heat-discharging box, said heat pipe transferring heat from said second heat source to an inside of said heat-discharging box so that heat is not transmitted through air in said environmental control chamber.

9. A method as claimed in claim 8, wherein said first heat source or said second heat source is provided plurally, and wherein said heat-discharging box is provided plurally corresponding to said plurality of said first heat sources or said second heat sources.

10. A method as claimed in claim 9, wherein said first heat source detachable from said main body of the device is a relay board for controlling an electrical instrument system of said main body of the device and wherein said relay board is disposed in said heat-discharging box.

11. A method as claimed in claim 9, wherein said second heat source undetachable from said main body of the device is a laser head for radiating laser light and wherein said heat pipe is disposed between said laser head and said heat-discharging box.

* * * * *